United States Patent
Jelonnek

(10) Patent No.: US 7,415,252 B2
(45) Date of Patent: Aug. 19, 2008

(54) ARRANGEMENT AND METHOD FOR DIGITAL PREDISTORTION OF A COMPLEX BASEBAND INPUT SIGNAL

(75) Inventor: Björn Jelonnek, Ulm (DE)

(73) Assignee: Nokia Siemens Networks GmbH & Co. KG, Munich (DE)

( * ) Notice: Subject to any disclaimer, the term of this patent is extended or adjusted under 35 U.S.C. 154(b) by 466 days.

(21) Appl. No.: 10/555,811

(22) PCT Filed: Apr. 2, 2004

(86) PCT No.: PCT/EP2004/050425

§ 371 (c)(1),
(2), (4) Date: Nov. 7, 2005

(87) PCT Pub. No.: WO2004/100482

PCT Pub. Date: Nov. 18, 2004

(65) Prior Publication Data

US 2007/0063769 A1    Mar. 22, 2007

(30) Foreign Application Priority Data

May 7, 2003   (DE) ................................ 103 20 420

(51) Int. Cl.
*H04M 7/00*      (2006.01)

(52) U.S. Cl. ................. 455/114.3; 455/114.2; 455/130; 455/341

(58) Field of Classification Search .............. 455/114.2, 455/114.3, 115.1, 127.1, 130, 91, 132, 341; 375/219, 260

See application file for complete search history.

(56) References Cited

U.S. PATENT DOCUMENTS

| 6,549,067 B1 | 4/2003 | Kenington |
| 2002/0027961 A1 | 3/2002 | Rexberg et al. |
| 2002/0181549 A1 | 12/2002 | Linnartz et al. |

FOREIGN PATENT DOCUMENTS

WO        02/39687        5/2002

*Primary Examiner*—Tony T Nguyen
(74) *Attorney, Agent, or Firm*—Staas & Halsey LLP

(57) ABSTRACT

A system and a method create a pre-distorted signal y(k) from an interpolated broadband baseband signal x(k) for a transmitter power amplifier having at least three branches to which the signal x(k) is respectively connected on the input side. A first branch contains a distortion device for taking into account memory effects of the transmitter power amplifier to which the signal x(k) is supplied on the input side. Where 2=j=n, each other j-th branch contains the following serially mounted elements: a deceleration device with a signal x(k) supplied on the input side, a first adder, a digital low-pass filter, and a second adder, the output signal formed by the second adder being used to create the pre-distorted signal y(k). The distortion device pertaining to the first branch is connected, on the input side, to another input of the second adder of the second branch, and on the output side, to another input of the first adder of the second branch.

18 Claims, 14 Drawing Sheets

FIG 5B $$\breve{y}_0(k) = \sum_{\eta=0}^{4} \overline{\alpha_\eta} y(k-2-\eta)$$

$$\breve{y}_1(k) = \sum_{\eta=0}^{4} \overline{\alpha_\eta} y(k-1-\eta)$$

$$\breve{y}_2(k) = \sum_{\eta=0}^{4} \overline{\alpha_\eta} y(k-\eta)$$

$$\breve{y}_3(k) = \sum_{\eta=0}^{4} \overline{\alpha_\eta} |y(k-2-\eta)|^2 y(k-2-\eta)$$

$$\breve{y}_4(k) = \sum_{\eta=0}^{4} \overline{\alpha_\eta} |y(k-1-\eta)|^2 y(k-1-\eta)$$

$$\breve{y}_5(k) = \sum_{\eta=0}^{4} \overline{\alpha_\eta} |y(k-\eta)|^2 y(k-\eta)$$

$$\breve{y}_6(k) = \sum_{\eta=0}^{4} \overline{\alpha_\eta} |y(k-1-\eta)|^4 y(k-1-\eta)$$

$$\breve{y}_7(k) = \sum_{\eta=0}^{4} \overline{\alpha_\eta} |y(k-1-\eta)|^6 y(k-1-\eta)$$

$$R_{\breve{y}\breve{y}}(i,j) = \sum_{k=0}^{N/\mu-1} \breve{y}_i^*(k \cdot u) \breve{y}_j(k \cdot u)$$

$$r_{\breve{y}z}(i) = \sum_{k=0}^{N/\mu-1} \breve{y}_i^*(k \cdot u) \bar{z}(k \cdot u)$$

ARRANGEMENT AND METHOD FOR DIGITAL PREDISTORTION OF A COMPLEX BASEBAND INPUT SIGNAL

CROSS REFERENCE TO RELATED APPLICATIONS

This application is based on and hereby claims priority to PCT Application No. PCT/EP2004/050425 filed on Apr. 2, 2004 and German Application No. 10320420.2 filed on May 7, 2003, the contents of which are hereby incorporated by reference.

BACKGROUND OF THE INVENTION

The invention relates to a system and a method for digital predistortion of a complex baseband input signal which is fed to a transmitted power amplifier to generate a high-frequency multicarrier transmit signal.

With newly introduced radio communication systems, such as the EDGE or the UMTS mobile radio system for example, linear forms of modulation are used in which a constant instantaneous power of a transmit signal is dispensed with. A maximum transmit signal amplitude which arises in a such case typically lies significantly above the average value of an associated transmit power.

In addition there are plans with the newly introduced radio communication systems to use multicarrier data transmission procedures (multicarrier approach) in which a plurality of transmit signals with different carrier frequencies are modulated with a high carrier frequency spacing and fed to a transmit amplifier. A coherent overlaying of all transmit signals in this case means that maximum amplitudes occur which lie far above the average value of the associated transmit power. A transmitter power amplifier must accordingly retain sufficient reserves of power for a linear amplifier operation.

Non-linearities of the transmit power amplifier effect the efficiency of the entire radio communication system. The non-linearities disadvantageously cause intermodulation products of which the carrier frequencies act as interference to disturb the carrier frequencies to be used. These disruptive interferences are suppressed by executing what is referred to as a predistortion of a power amplifier input signal. A distinction is to be made here between an "analog" and a "digital predistortion", with the digital predistortion offering easier reproducibility and higher flexibility.

A basic block diagram in accordance with the related art is shown in FIG. 13 for example.

A complex digital baseband input signal BEIS is connected both to a device for predistortion PRE of a forwards branch and also to a device for parameter estimation PPRE. In addition to the device for predistortion PRE the forwards branch contains a serial downstream compensation device COM, of a digital-analog converter DAC, a transmit filter causing linear distortions TxF, a modulator MOD and a transmit power amplifier AMP.

A broadband high-frequency multicarrier transmit signal is provided at the output of the transmit power amplifier AMP. The transmit power amplifier AMP is connected on the output side to a demodulator DEM arranged in a feedback branch. The feedback branch features a receive filter RxF following on from the demodulator DEM in series and an analog-digital converter ADC which is connected on its output side with the device for parameter estimation PPRE.

The device for parameter estimation PPRE forms parameters for a predistortion of the baseband input signal BEIS to be performed, with the parameters formed being transmitted to the device for predistortion PRE. With the aid of the compensation device COM linear distortions of the transmit filter TxF, of the modulator MOD and partly of the transmit power amplifier AMP are compensated for.

In the digital predistortion to be performed a restriction of a transmit signal bandwidth is necessary since with the device for predistortion PRE a static non-linearity of the transmit power amplifier AMP is assumed and simulated inverted. For precise implementation of the digital predistortion, taking into account the static non-linearity of the transmit power amplifier AMP at least one reproduction of a third or fifth harmonics of the multicarrier transmit signal is needed, in which case for the D/A converter DAC used at least one triple bandwidth of the multicarrier send signal is needed in the forwards branch.

The same applies to the A/D converter ADC in the feedback branch, to which a broadband predistortion output signal of the device for predistortion PRE is fed via the following modules (COM, DAC, TxF, MOD, AMP, DEM and RxF). For a multicarrier transmit signal with a bandwidth of 60 MHz, corresponding to the UMTS standard, very wide band and cost-intensive A/D converters or D/A converters are thus required.

In this case it should also be stated in conclusion that both the parameter estimation PPRE and also the predistortion PRE are performed with a sampling frequency which is determined by a clock frequency of the D/A converter DAC or of the A/D converter ADC used.

SUMMARY OF THE INVENTION

One possible object of the present invention is to implement a system and a method for a digital predistortion of a complex baseband input signal which is fed to a transmit power amplifier to create a high-frequency multicarrier transmit signal such that the multicarrier transmit signal is generated cost effectively and in this case interference is suppressed both in a useful frequency band and only slight harmonic distortion components occur in an ambient frequency range.

A method for linearization of an output signal is known from U.S. Pat. No. 6,549,067. In this case in-phase and quadrature input signals are digitally pre-distorted and digitally transformed upwards in an intermediate frequency range. Subsequently a digital/analog conversion is performed and a conversion into a radio frequency band is undertaken.

A so called "Off-Line MCPA Calibration" is known from US 2002/0027961. In this case, before a signal is amplified, a predistortion is undertaken for linearization of a signal.

With the aid of the method and system proposed by the inventor, a signal x(k) is digitally predistorted by a non-linear function, which takes into account the memory effects of a transmit power amplifier with the aid of a device for broadband predistortion. These types of memory effect arise for example as a result of high modulations of the transmit power amplifier or rapid changes of state in the transmission system.

Especially advantageously digital signal processing is performed for broadband predistortion with a high digital sampling frequency, while a subsequent D/A converter in the forwards branch or A/D converter in the feedback branch needs a narrower bandwidth by contrast.

The method and system make it possible, within a useful band covered by the D/A converter for an extinction of an error signal caused by non-linearities of the transmit power amplifier to be achieved. This makes it possible for the D/A converter to operate using a sampling rate that is only between one and two times that of the digital sampling frequency.

The method and system are used for example in conventional heterodyne or superheterodyne concepts with downstream power amplifier and filter or is used with a plurality of standards with transmit power amplifiers which are used for amplification of a high-frequency multicarrier transmit signal.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
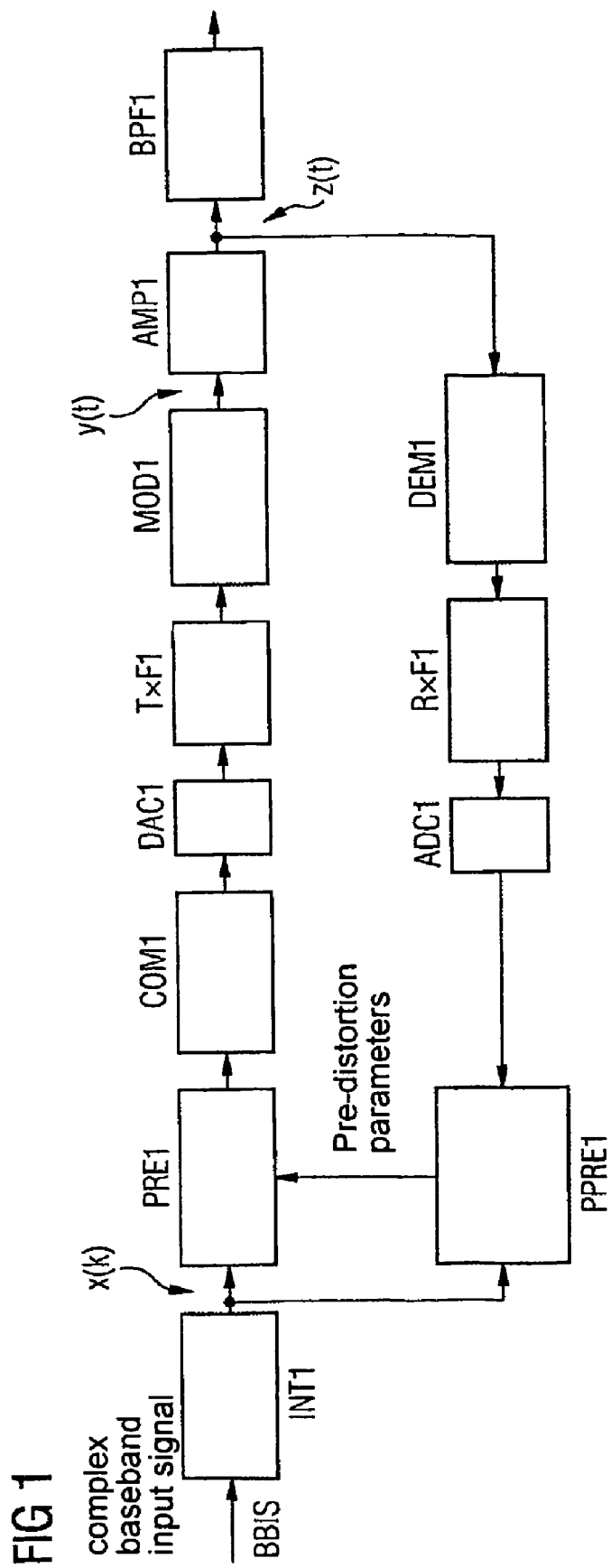
FIG. 1 a basic block diagram for one embodiment of the inventor.

Reference will now be made in detail to the preferred embodiments of the present invention, examples of which are illustrated in the accompanying drawings, wherein like reference numerals refer to like elements throughout.

FIG. 1 shows a basic block diagram for use of the inventive arrangement.

A complex digital baseband input signal BBIS arrives via an interpolation device INT1 as a signal x(k) both at a device for broadband predistortion PRE1 of a main branch as also at a device for broadband parameter estimation PPRE1.

The device for broadband predistortion PRE1 is a series circuit with a compensator device COM1 to compensate for linear distortions, with a D/A converter DAC1, with a transmit filter TxF causing linear distortions, with a modulator MOD1 and with the transmit power amplifier AMP1 connected downstream.

At the output of the modulator MOD1 a signal y(t) is present which is fed via the transmit power amplifier AMP1 as a high-frequency multicarrier signal z(t) to a feedback branch. The feedback branch features, connected in series, a demodulator DEM1, a broadband receive filter RxF1 and an A/D converter ADC1, which is connected on the output side to the device for broadband parameter estimation PPRE1. The device for broadband parameter estimation PPRE1 is connected to the device for broadband predistortion PRE1, with estimated parameters reaching the device for broadband distortion PRE1.

The digital signal processing is undertaken at a higher digital sampling frequency, whereas converter types with a low sampling frequency can be used as D/A converter DAC1 or for A/D converter ADC1.

Outside a desired useful transmit signal band the amplitudes of mixed products arising are reduced by an additional analog bandpass filter BPF1 connected downstream from the transmit power amplifier AMP1.

The device for broadband predistortion PRE1 needs wide band information about distortions of the entire transmission system shown as a block diagram in FIG. 1.

In this case the bandwidths and sampling frequencies of the A/D converter ADC1 or the D/A converter DAC1 used represent a basic problem. Subsequently the bandwidth of the receive filter RxF1 is thus modified such that the higher Nyquist frequencies are used for the A/D converter ADC1, which allows the sampling frequency of the A/D converter ADC1 to be reduced.

An algorithm needed for this is subsequently described for modeling of the transmit power amplifier AMP1, in which case a non-linear transmission system susceptible to memory effects is a requirement.

Figure 2:
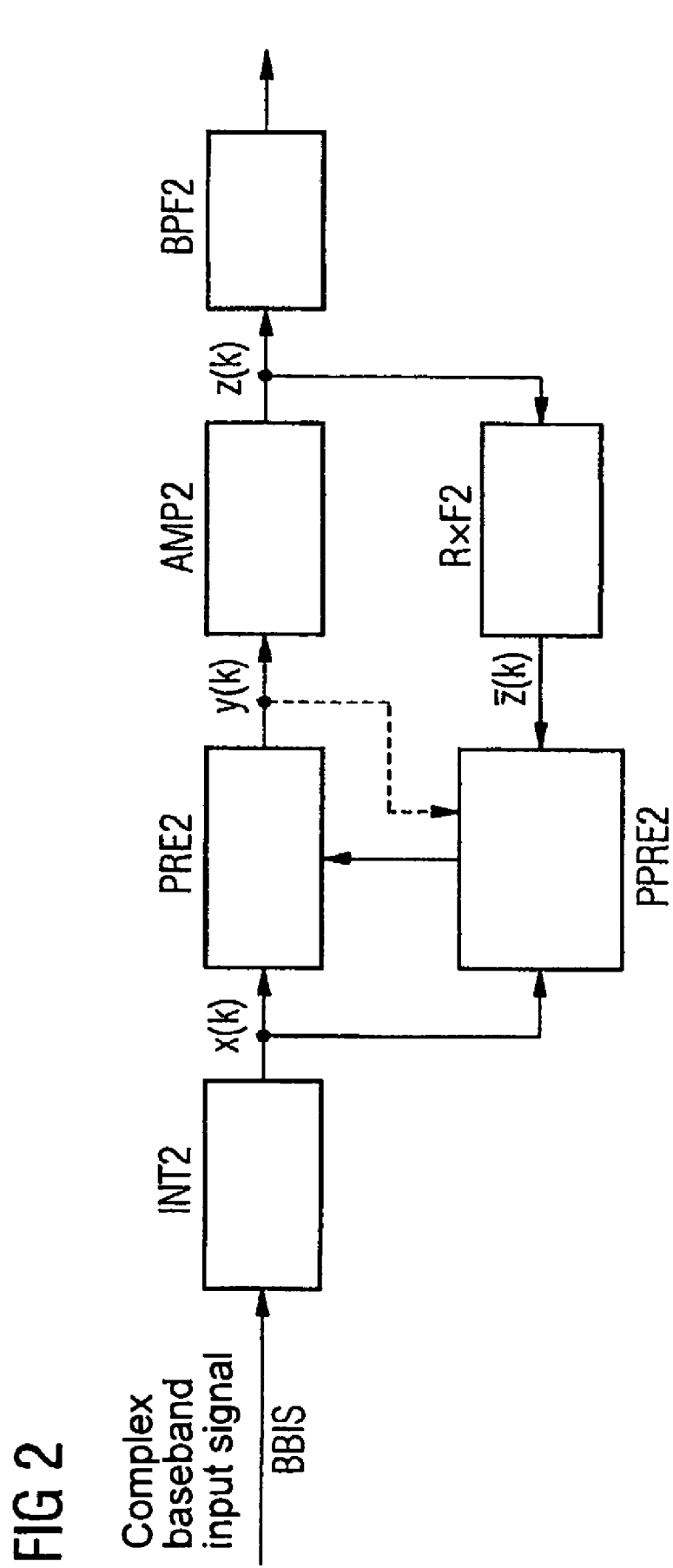
FIG. 2 compared to FIG. 1, a simplified basic block diagram as a time-discrete equivalent system for using the method and system, FIG. 3 an equivalent circuit diagram based on a Laurent series development of the transmit power amplifier shown in FIG. 2, FIG. 4 by comparison with FIG. 3, an equivalent circuit diagram based on a simplified Laurent series development, FIG. 5 an implementation example with formulae for a parameter estimation described in FIG. 4, FIG. 6 a basic block diagram of one embodiment of the inventor, FIG. 7 an equivalent circuit diagram based on a simplified Laurent series development of a distortion device shown in FIG. 6, FIG. 8 a basic block diagram of one embodiment of the inventor which dispenses with the predistortion of error signals undertaken in FIG. 6, FIG. 9 a principle block diagram of the arrangement in accordance with one embodiment of the inventor dispensing with the predistortion of the input signal performed in FIG. 8, FIG. 10 a basic block diagram with two transmit power amplifiers for use of one embodiment of the inventor, FIG. 11 by comparison with FIG. 10, a simplified basic block diagram as a time-discrete equivalent system for using the system, FIG. 12 a basic block diagram of the system when two transmit power amplifiers are used, and FIG. 13 the basic block diagram in accordance with the related art described in the introduction.

FIG. 2 shows, by comparison with FIG. 1 a simplified basic block diagram as a time-discrete equivalent system for using the proposed method and system.

By comparison with FIG. 1 it is assumed below that the baseband input signal BBIS is sampled in such a way that maximum frequency components of the analog multicarrier transmitter signal z(k) are sufficiently well described. It is further required that the demodulator DEM1 performs bandpass filtering around a desired useful frequency band.

Furthermore equalizations of linear impulse responses of the D/A converter DAC1, of the transmit filter TxF1 and of the transmit power amplifier AMP1 are combined and regarded as compensated for by the compensation device COM1. Any non-linearities of the D/A converter DAC1 and of the modulator MOD1 are combined with non-linearities of the transmit power amplifier AMP1.

Under the conditions given above the simplified block diagram shown in FIG. 2 is produced for FIG. 1 in the equivalent time-discrete baseband.

In this case a signal x(k) formed by interpolation by an interpolation device INT2 as an input signal reaches both a device for broadband predistortion PRE2 and also a device for broadband parameter estimation PPRE2. The device for broadband predistortion PRE2 is connected on its output side to a transmit power amplifier AMP2 downstream of which the complex baseband transformed bandpass filer BPF2 is connected.

The transmit power amplifier AMP2 is connected on its output side to a broadband receive filter RxF2 downstream from which in its turn the device for broadband parameter estimation PPRE2 is connected.

The transmit power amplifier AMP2 to which a signal y(k) is fed from a device for broadband predistortion PRE2 forms from this signal a signal z(k) as a high-frequency multicarrier signal, which in this diagram is viewed in the complex baseband. Via the broadband receive filter RxF2 the signal z(k) reaches the device for broadband parameter estimation PPRE2.

Figure 3:
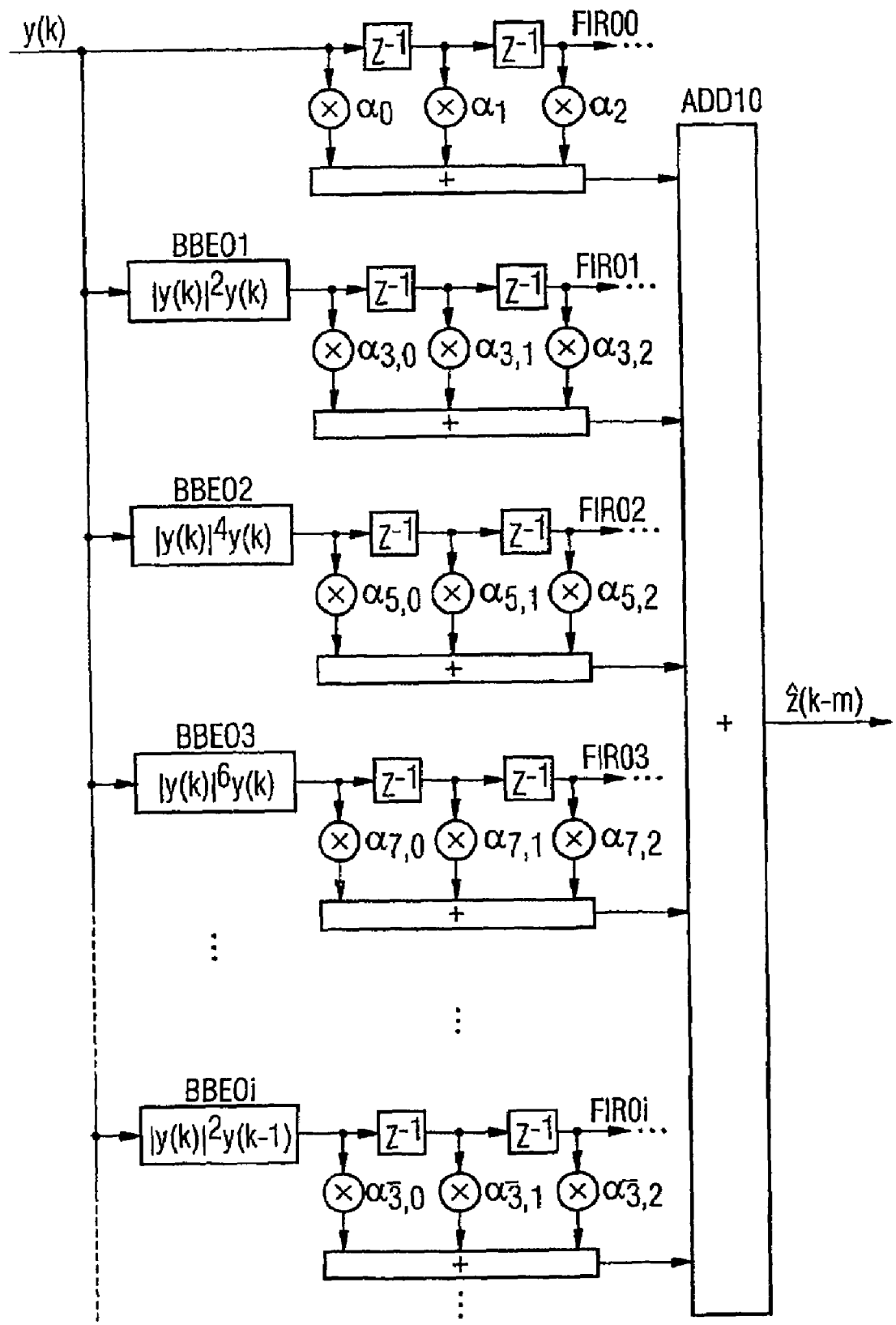

FIG. 3 shows a Laurent series development-based equivalent circuit diagram of the transmit power amplifier AMP2 shown in FIG. 2. In this case a measurement receiver implemented by a broadband receive filter RxF2 is also taken into account.

With the aid of a parameter estimation depicted below the signal z(k) shown in FIG. 2 is modelled with the aid of a measurable signal also shown in FIG. 2 $\bar{z}(k)$ on the basis of known signal values of the signal y(k).

It applies as a prerequisite or as a target function:

In this case $\hat{z}(k)$ is to be regarded as a simulation of z(k).

$$\sum_k |z(k) - \hat{z}(k)|^2 \stackrel{!}{=} \min$$

A simulation based on parameters of $\hat{z}(k)$ is for example performed with the aid of a Laurent series development:

$$\hat{z}(k-m) = \sum_v \alpha_v y(k-v) +$$
$$\sum_{v_1}\sum_{v_2} \alpha_{v_1 v_2} y^*(k-v_1) y(k-v_2) +$$
$$\sum_{v_1}\sum_{v_2} \tilde{\alpha}_{v_1 v_2} y(k-v_1) y(k-v_2) +$$
$$\sum_{v_1}\sum_{v_2}\sum_{v_3} \alpha_{v_1 v_2 v_3} y^*(k-v_1) y(k-v_2) y(k-v_3) + \ldots$$

For a causal system a delay time m is accordingly selected.

To reduce the effort needed for implementation or to reduce computation times it is advantageous to use only specific parts of the Laurent series development since, by comparison with FIG. 1, only a specific frequency range of the output signal z(t) is to be linearized by the power amplifier AMP1.

Mixed frequency products are created by quadratic non-linearities of the transmit power amplifier AMP1 shown in FIG. 1, which are however suppressed by bandpass characteristics of the modulation to be performed in the forwards branch (MOD1, AMP1) or demodulation in the feedback branch (DEM1, RxF1).

Thus with an ideal modulation in the forwards direction or demodulation with bandpass filtering in the feedback direction no quadratic harmonic occurs in the demodulated complex baseband signal, with this observation applying for all even-number harmonic.

Parasitic effects, such as for example a crosstalk of a mixed frequency in a mixed output signal, lead to even-number harmonics in the output signal of the demodulation, which in any event exhibit a very low amplitude. If a reduction of the number of elements for a Laurent series development is now to be performed for a practical implementation, it is advantageous to limit oneself to odd-number harmonics.

The following equation then applies:

$$\hat{z}(k-m) = \sum_v \alpha_v y(k-v) +$$
$$\sum_{v_1}\sum_{v_2} \alpha_{v_1 v_2} y^*(k-v_1) y(k-v_2) +$$
$$\sum_{v_1}\sum_{v_2} \tilde{\alpha}_{v_1 v_2} y(k-v_1) y(k-v_2) +$$
$$\sum_{v_1}\sum_{v_2}\sum_{v_3} \alpha_{v_1 v_2 v_3} y^*(k-v_1) y(k-v_2) y(k-v_3) + \ldots$$

FIG. 3 now shows an equivalent circuit diagram based on this reduced-effort Laurent series development.

Here the input signal y(k) on one side directly via a FIR filter FIR00 to an adder ADD10 and on the other side via a plurality of summation/multiplication devices BBE01 to BBE0i to further FIR filters FIR01 to FIR0i, which are connected downstream from the summation/multiplication devices BBE01 to BBE0i. The further FIR filter FIR01 to FIR0i are connected on the output side to the adder ADD10, with the aid of which the signal $\hat{z}(k-m)$ is formed.

The signal z(k) is not directly available to an estimation algorithm implemented in the device for broadband parameter estimation PPRE2. Non-ideal receive filters, mixer and A/D converters cause at least partly a linear frequency curve at the measurement receiver, which in accordance with FIG. 2 is part of the broadband receive filter.

For these reasons, instead of the target function shown above for modelling the transmit power amplifier, the modelling is performed on the basis of measurable signal values of the signal $\tilde{z}(k)$.

For an adaptation of the parameters the following equation is used as a target function:

$$\sum_k |\tilde{z}(k) - \hat{z}(k)|^2 \stackrel{!}{=} \min$$

In this case characteristics of the transmit power amplifier are masked out in relation to its linear frequency response. The method operates as if a frequency response of the transmit power amplifier were to remain constant over an observed frequency range. The aim of the modelling used here is essentially the modelling and later reduction of non-linear characteristics of the transmit power amplifier AMP2.

As shown below exact knowledge of its linear characteristics are not needed here, whereby linear memory effects can be separated from non-linear memory effects.

This produces a modified Laurent series development which in the formula below is again typically restricted to the essentially odd-number harmonics:

$$\hat{z}(k-m) = \sum_v \bar{\alpha}_v \tilde{z}(k-m-v)$$

$$\tilde{z}(k-m_1) = y(k-L) + \sum_v \beta_{3,v} |y(k-v)|^2 y(k-v) +$$
$$\sum_v \beta_{5,v} |y(k-v)|^4 y(k-v) + \ldots +$$
$$\sum_v \beta_{3,v} |y(k-v)|^2 y(k-1-v) +$$
$$\sum_v \beta_{3,v} |y(k-v)|^2 y(k+1-v) + \ldots$$

Because of the splitting undertaken, the number of parameters of the transmit power amplifier model parameters to be adapted is reduced. With the use of $\hat{z}(k)$ in the equation of $\tilde{z}(k)$ a non-linear equation system is obtained based on the parameters $\bar{\alpha}$ and $\beta$.

$$\hat{z}(k-m) = \left[\sum_{\mu} \overline{\alpha}_{\mu} y(k-L-\mu)\right] +$$
$$\sum_{v} \beta_{3,v}\left[\sum_{\mu} \overline{\alpha}_{\mu}|y(k-v-\mu)|^2 y(k-v-\mu)\right] +$$
$$\sum_{v} \beta_{5,v}\left[\sum_{\mu} \overline{\alpha}_{\mu}|y(k-v-\mu)|^4 y(k-v-\mu)\right] + \ldots +$$
$$\sum_{v} \beta_{3,v}\left[\sum_{\mu} \overline{\alpha}_{\mu}|y(k-v-\mu)|^2 y(k-1-v-\mu)\right] + \ldots$$

Figure 4:
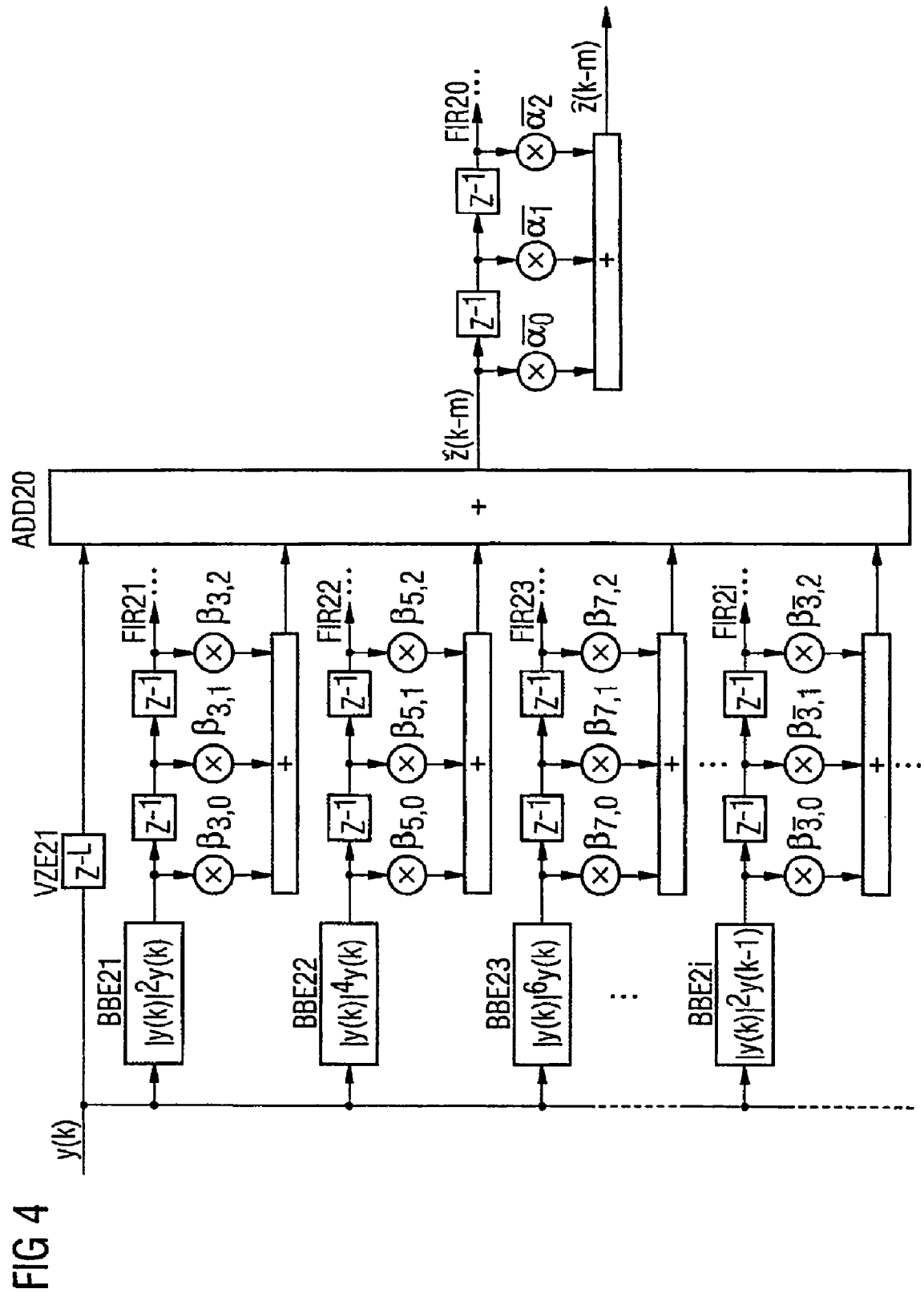

FIG. 4 now shows, by comparison with FIG. 3, an equivalent circuit diagram based on this Laurent series development.

Here the input signal y(k) one on side arrives directly via a delay unit VZE21 at an adder ADD20 and on the other side via a plurality of summation/multiplication devices BBE21 to BBE2i at FIR filters FIR21 to FIR2i, which are individually connected downstream from the absolute value generation/multiplication devices BBE21 to BBE2i. The FIR filters FIR21 to FIR2i connected on the output side to the adder ADD20, with the aid of which a signal z̃(k−m) is formed. This signal z̃(k−m) reaches an FIR filter FIR20 connected downstream from the adder ADD20 with the aid of which linear distortions in the measurement receiver are taken into account. Finally the signal ẑ(k−m) is formed by the FIR filter FIR20.

By comparison with FIG. 3, the simplified Laurent series development shown here contains in what is referred to as a direct branch only the delay unit VZE21, with the aid of which a propagation delay by L units of time is implemented.

On the basis of the target function shown above in the sense of a minimum square error, with given parameters $\overline{\alpha}$ the parameters β are determined by resolving a linear equation system The parameters $\overline{\alpha}$ can for example be determined by an iteration process. Two typical approaches to solutions are described below.

In a first approach a linear Rx impulse response is estimated directly. In this case an additional index i represents an ith step of the iteration process. Basic vectors used are marked by pointed brackets.

The following applies:

$$\hat{z}_i(k-m) = \sum_{\mu} \overline{\alpha}_{\mu,i}[y(k-L-v-\mu)] +$$
$$\sum_{v} \beta_{3,v}\left[\sum_{\mu} \overline{\alpha}_{\mu,i-1}|y(k-v-\mu)|^2 y(k-v-\mu)\right] +$$
$$\sum_{v} \beta_{5,v}\left[\sum_{\mu} \overline{\alpha}_{\mu,i-1}|y(k-v-\mu)|^4 y(k-v-\mu)\right] + \ldots +$$
$$\sum_{v} \beta_{3,v}\left[\sum_{\mu} \overline{\alpha}_{\mu,i-1}|y(k-v-\mu)|^2 y(k-1-v-\mu)\right] + \ldots$$

This equation system can then be represented by a convolution matrix $Y_i$:

$$\underline{\tilde{z}} = \underline{Y}_i \begin{bmatrix} \underline{\overline{\alpha}}_i \\ \underline{\beta}_i \end{bmatrix}$$

with vector $$\underline{\tilde{z}} = \begin{bmatrix} \tilde{z}(k) \\ \tilde{z}(k-1) \\ \tilde{z}(k-2) \\ \ldots \end{bmatrix}$$

and vector $$\begin{bmatrix} \underline{\alpha}_i \\ \underline{\beta}_i \end{bmatrix}$$

containing the parameters.

Vectors and matrices are shown underscored. Thus the solution in the sense of the minimum error square is produced by:

$$\begin{bmatrix} \underline{\overline{\alpha}}_i \\ \underline{\beta}_i \end{bmatrix} = (\underline{Y}_i^* \underline{Y}_i)^{-1} \underline{Y}_i^* \underline{z}$$

In this case $\underline{Y}_i^* \underline{Y}_i$ is a cross correlation matrix and $\underline{Y}_i^* \underline{z}$ is a cross correlation vector. To resolve the above equation system different iterative or block-oriented methods can be used.

If the parameters $\overline{\alpha}_i$ are determined, they are used to improve a convolution matrix $\underline{Y}_{i+1}$.

The previous observation implicitly required a sampling rate of the A/D converter which corresponds to that of the interpolated signal. If however the A/D converter is restricted in its maximum sampling rate, only specific lines from the equation system specified above are available. Regardless of this the parameters are calculated with reference to the above presentation, since the equation system used remains completely determined.

The parameters also remain fully determined if only one real A/D converter is present that is only a subsampled real part of the equation system mentioned above is used.

With an alternative second approach to the solution the following relationship is used as a basis with less implementation effort:

$$\hat{z}(k-m) = \sum_{\mu} \tilde{\alpha}_{v,i}\left[\sum_{\mu} \overline{\alpha}_{\mu,i-1} y(k-L-v-\mu)\right] +$$
$$\sum_{v} \beta_{3,v}\left[\sum_{\mu} \overline{\alpha}_{\mu,i-1}|y(k-v-\mu)|^2 y(k-v-\mu)\right] +$$
$$\sum_{v} \beta_{5,v}\left[\sum_{\mu} \overline{\alpha}_{\mu,i-1}|y(k-v-\mu)|^4 y(k-v-\mu)\right] + \ldots +$$

-continued $$\sum_{v} \beta_{\overline{3},v}\left[\sum_{\mu} \overline{\alpha}_{\mu,i-1}|y(k-v-\mu)|^2 y(k-1-v-\mu)\right]+\dots$$

whereby with the vector $$\left[\frac{\tilde{\alpha}_i}{\beta_i}\right]$$

a solution can also be determined in the sense of a minimum error square.

With the convolution relationship $$\overline{\alpha}_{\mu,i} = \alpha_{\mu,i} * \overline{\alpha}_{\mu,i-1}$$

the parameters $\overline{\alpha}_{\mu,j}$ can be calculated. Since with parameters ã(k) only deviations of the estimated impulse responses of the receive filter are involved, an estimation of few parameters is sufficient here.

The significant fact is that with both solution approaches a linear part of the model described by the parameters β is reduced to a simple propagation delay and that the estimation can also be executed with a reduced sample rate of the A/D converter.

By the above iteration process a linear amplitude factor is standardized to a value=1 and transferred into the parameters ∝. The model shown in FIG. 4 of a non-linearity susceptible to memory effects is produced as a result.

For example a Laurent series is used especially advantageously as a basic function, with other basic functions being able to be used as polynomials without restrictions.

In this case, instead of the combined absolute value generation/multiplication devices BBE21 to BBE2i, depending on the series development separate absolute value generation and/or multiplication devices can also be used.

Figure 5A:
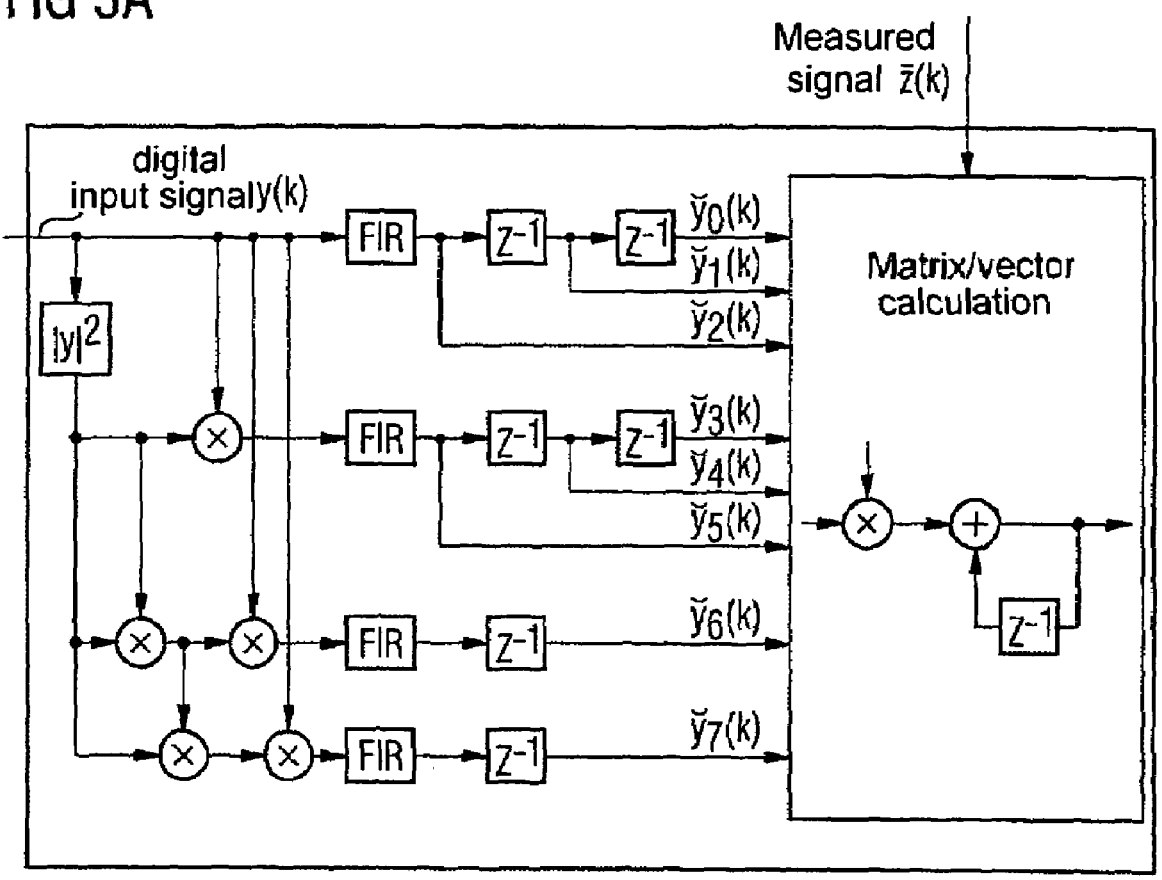

FIG. 5 shows an implementation example with formulae for the parameter estimation described in FIG. 4.

In this case auxiliary signals $\check{y}_0(k)$ to $\check{y}_7(k)$ are calculated as follows: The digital input signal y(k) reaches FIR filters directly on one side and on the other side via absolute value generators/multiplication stages.

All parameters $\overline{\alpha}_n$ of the FIR filters used are the same in each case and represent an approximation of the frequency response of the receive filter RxF2. They are used with different time delays in combination with the tunable output signal $\overline{z}(k)$ in a matrix-vector computation unit, in which case an auto correlation matrix $R_{\overline{yy}}(i,j)$ or cross-correlation vector $r_{\overline{yz}}(i)$ is calculated. A subsampling factor u is introduced, with which the sampling frequency of the A/D converter can be operated at a reduced rate compared to the sampling frequency of the D/A converter.

Figure 6:
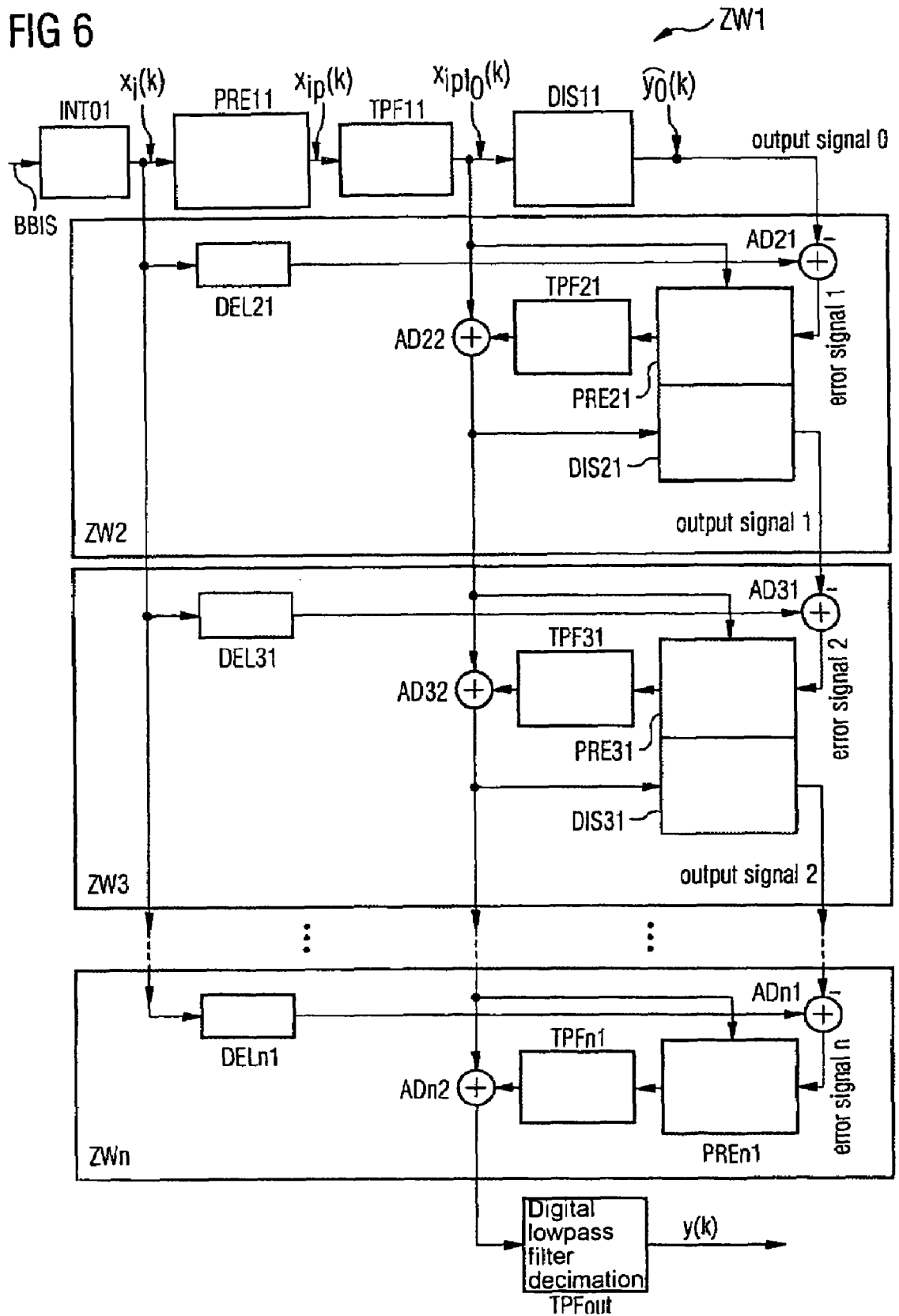

FIG. 6 shows a basic block diagram of the arrangement in accordance with the one embodiment of $A_c$ invention.

By comparison with FIG. 2 the baseband input BBIS, as input signal $x_i(k)$ passes via an interpolation unit INT01 to arrive both at a first branch ZW1 designated as the main branch and also at further branches ZW2 through ZWn, designated as auxiliary branches.

The main branch and the auxiliary branches in this case represent the device for predistortion PRE2 described in FIG. 2.

With j=1 the first branch ZW1 contains, connected in series, a predistortion unit PRE11 which does not take account of any memory effects of the transmit power amplifier, a digital lowpass filter TPF11 and distortion unit DIS11 which takes account of the memory effects. The input signal $x_i(k)$ arrives via the predistortion unit PRE11 as a signal $x_{ip}(k)$ at the lowpass filter TPF11. Its output signal arrives as signal $x_{ipio}(k)$ via the predistortion unit DIS11 as signal $\hat{y}_0(k)$ at a second branch ZW2.

With $2 \leq j \leq n-1$ a jth branch ZWj features the following components connected in series to each other: A delay unit DELj1, of a first adder ADj1, a predistortion unit PREj1 which does not take account of any memory effects, a digital lowpass filter TPFj1, a second adder ADj2 and a predistortion unit DISj1 which takes account of memory effects.

With j=n the nth branch ZWn merely contains a series circuit with a delay unit DELn1, a first adder ADn1, a predistortion unit PREn1 which does not take account of any memory effects, a digital lowpass filter TPFn1 and a second adder ADn2.

With $2 \leq j \leq n$ the input signal xi(k) is connected on the input side an the delay unit DELj1 of the jth branch ZWj. The delay unit DELj1 is connected on the output side to a first input of the first adder ADj1, with an error signal being formed by addition here. The first adder ADj1 is connected on the output side to a first input of the predistortion unit PREj1, to which the error signal formed is fed. The predistortion unit PREj1 is connected downstream from the lowpass filter TPFj1 which is connected on the output side to a first input of the second adder ADj2.

With $2 \leq j \leq$ sn the second adder ADj2 of the jth branch ZWj is connected on the output side on the one hand directly to a second input of the second adder AD(j+1)2 of a subsequent branch ZWj+1 and to a second input of the predistortion unit PRE(j+1)1 of subsequent j+1th branch ZWj+1. On the other hand it is connected via the predistortion unit DISj1 to the jth branch ZWj to a second input of the first adder AD(j+1)1 of the j+1th branch ZWj+1.

With j=2, for the jth branch ZWj the second input of the second adder ADj2 and the second input of the predistortion unit PREj1 are connected to an output of the lowpass filter TPF11 of the first branch ZW1, while the second input of the first adder ADj1 is connected to an output of the predistortion unit DIS11 of the first branch ZW1.

With $1 \leq j \leq n-1$ a negated estimated signal of the transmit power amplifier is formed by the predistortion unit DISj1 of a jth branch ZWj and transferred to the second input of the first adder AD(j+1)1 of the subsequent branch in each case.

A summation signal formed by the second adder ADn2 of the nth branch ZWn passes through a digital lowpass filter TPFout to reach the subsequent transmit power amplifier as predistortion signal y(k). If the D/A converter used needs a low sample rate, a decimation of the sample rate can be undertaken here.

As regards simple implementation, the predistortion units PRE11 to PREn1 shown here implement a static predistortion with a non-linear characteristic curve. In this case memory effects of the transmit power amplifier are not taken into account. The characteristic curve of the static predistortion is determined by the above parameters β.

For example a power series development can be calculated with the equation $$\chi_1 = 1, \chi_3 = \sum_v \beta_{3,v}, \chi_5 = \sum_v \beta_{5,v}, \ldots$$

which describes an average AM-AM and AM-PM characteristic of the transmit power amplifier for a mid frequency for example.

This characteristic curve is for example applied inverted to the interpolated input data xi(k).

The predistortion signal xip(k) typically has a higher bandwidth than a D/A converter to be used. Therefore the bandwidth of the predistorted output signal y(k) from FIG. 6 will be reduced to the bandwidth of the multicarrier signal to be sent plus a frequency range at the band limits. Especially advantageously the above-mentioned lowpass filters TPF11 to TPFn1 are used with same frequency response as a D/A converter used later for band limitation of the input signal.

The predistorted signal xip(k) undergoes degradation as a result of the band restriction. Higher frequency components especially are not correctly predistorted. The error signal described above is determined with reference to an estimated transmission function of the transmit power amplifier liable to memory effects by comparison with the transmitted and the corresponding time-delayed signal.

Viewed in conclusion, error signals are formed by the first adders AD21 to ADn1 in each case, which in the final analysis are fed to the second adders AD22 to ADn2 of the assigned branch. The distortion units DIS11 to DIS31 on the other hand form an estimated output signal of the transmit power amplifier, with the estimated output signal being formed to take into account memory effects of the transmit power amplifier. The second adders AD22 to ADn2 form on the output side a proportionate signal y(k), which is cascaded down to the last branch ZWn through addition in each case, with the signal y(k) being formed after output-side filtering by the lowpass filter TPFout. In this case the signal xipio(k) of the first branch ZW1 shown is also viewed as a proportionate signal y(k) which is transferred to the subsequent branch ZW2.

Digital filters embodied here or subsequently as lowpass filters can also be embodied as bandpass filters.

Figure 7:
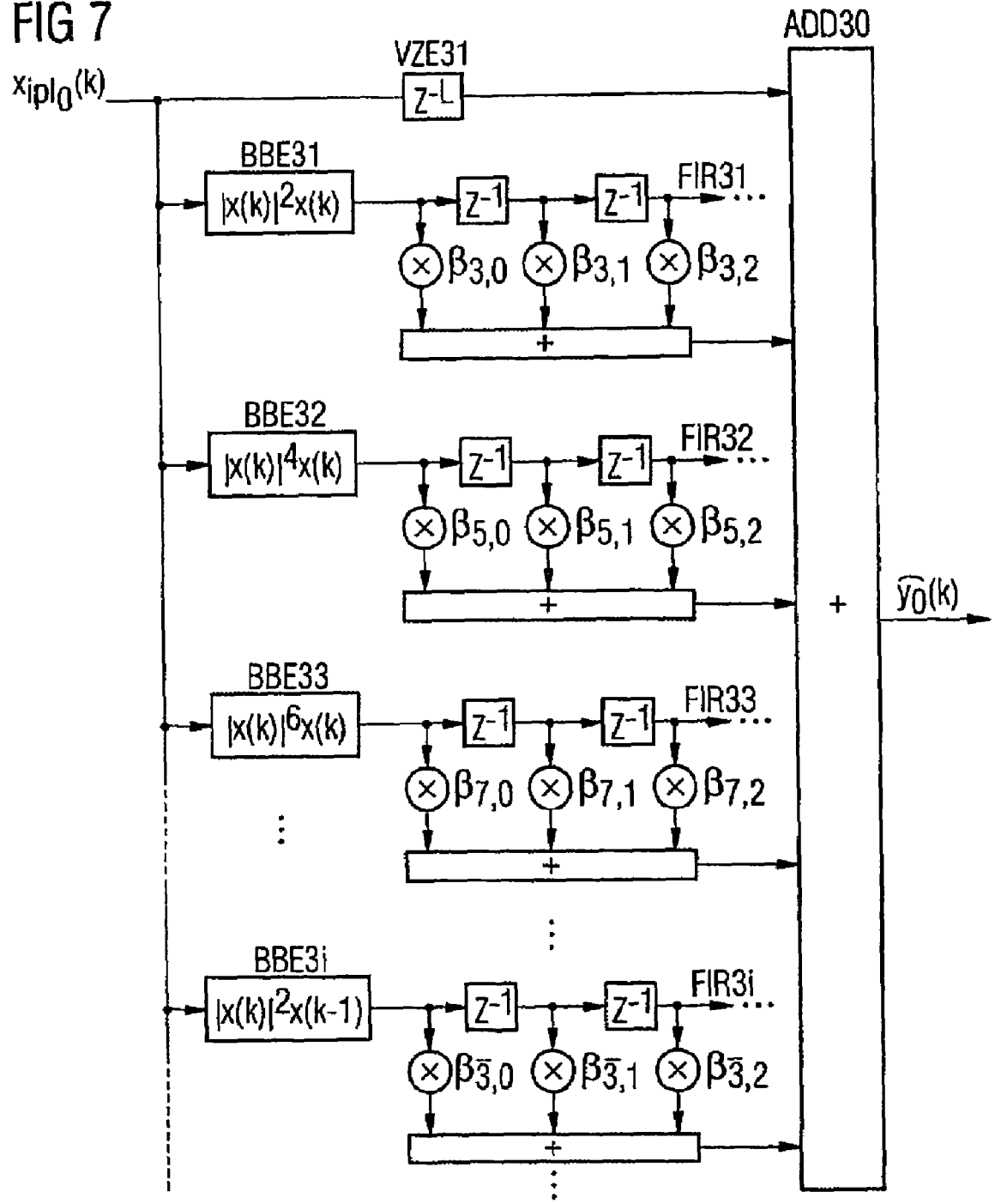

FIG. 7 shows an equivalent circuit diagram based on a simplified Laurent series development of the distortion units DISj1 shown in FIG. 6 with $1 \leq j \leq n-1$.

As described in FIG. 4 the requirement here is that, with modelling of the transmit power amplifier which is susceptible to memory effects a linear component can be separated off and a simple time delay is used for the description of a non-linear component. This is implemented by a delay unit VZE31 which delays by L units of time.

Viewed as representative of all other distortion devices DISj1 an input signal $x_{ipio}(k)$ arrives at the distortion unit DIS11 of the first branch ZW1 on the one hand directly via the delay unit VZE31 at an adder ADD30 and on the other hand via a plurality of absolute number generation and/or multiplication devices BBE31 to BBE3i at FIR filters FIR31 to FIR3i, which are connected individually downstream from the absolute number generation and/or multiplication devices BBE31 to BBE3i.

The FIR filters FIR31 to FIR3i are connected on the output side to the adder ADD30, with the aid of which the signal $\hat{y}_0(k)$ shown in FIG. 6 is formed. For computation of the signal $\hat{y}_0(k)$ the reader is referred to the appropriate formulae described in FIG. 4.

The fact that the linear component of the transmit power amplifier in accordance with FIG. 6 and FIG. 7 is only implemented as a delay unit VZE31 ensures that linear signal components are extinguished.

Remaining non-linear signal components are significantly smaller than the linear signal components which means that a small signal approximation is required. Depending on an amplitude of the signal predistorted by the predistortion unit, the amplification of the error signal in the subsequent predistortion unit or distortion unit changes in each case, with the error signal for the originally predistorted signal being added—by comparison with the predistortion units PREj1, j=2, ... n, from FIG. 6.

Figure 8:
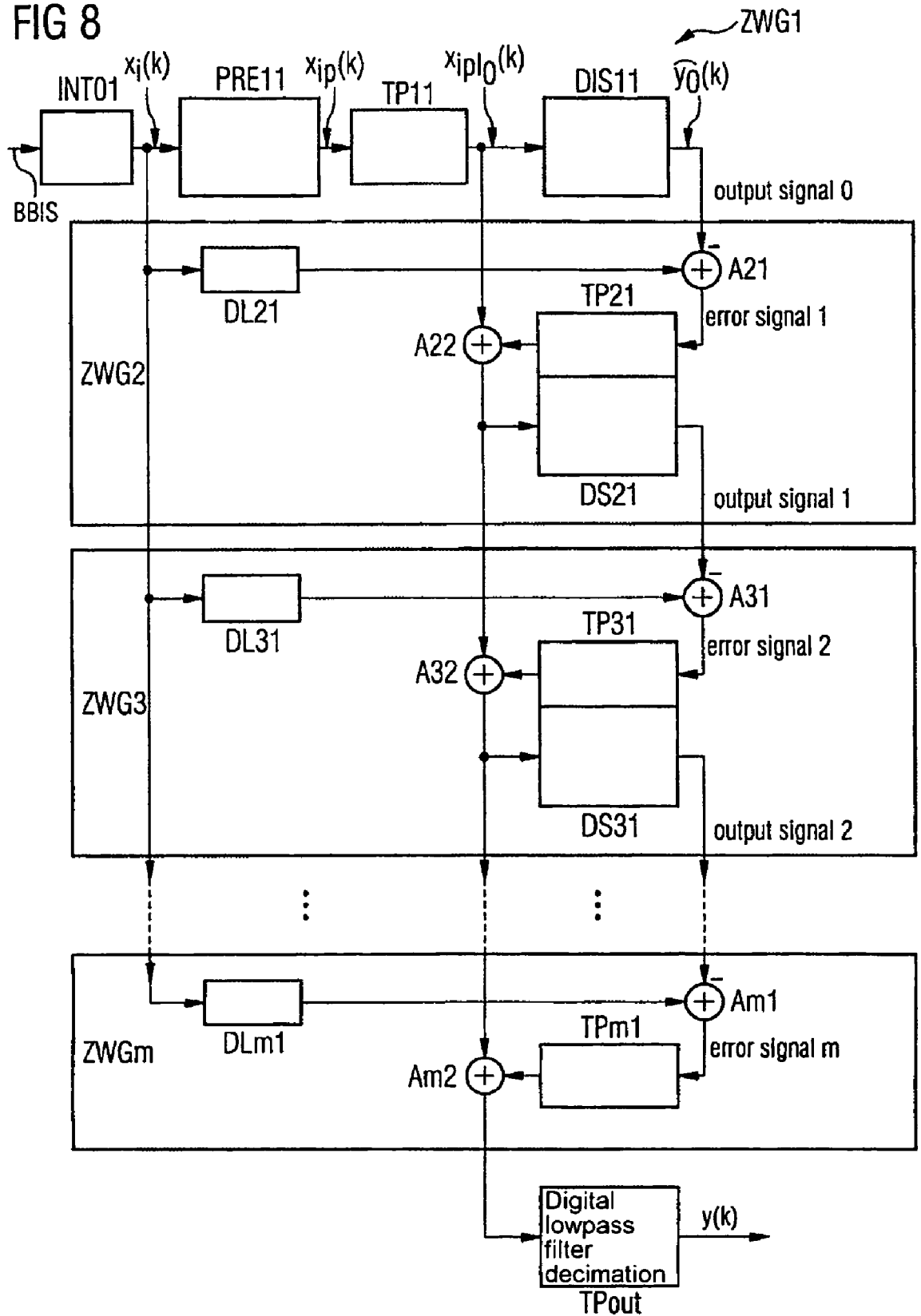

FIG. 8 shows a basic block diagram of the system which dispenses with the predistortion of error signals undertaken in FIG. 6, assuming a plurality of m branches with men.

By comparison with FIG. 6, the baseband input signal BBIS passes via an interpolation unit INT01 as input signal $x_i(k)$ reaching both a first branch ZWG1 designated as a main branch and also further parallel branches ZWG2 to ZWGm, designated as auxiliary branches.

With j=1 the first branch ZWG1 contains, connected in series, a predistortion unit PR11 which is implemented as time-invariant predistortion, a digital lowpass filter TP11 and distortion unit DS11 which takes account of the memory effects. The input signal $x_i(k)$ arrives via the predistortion unit PR11 as a signal $x_{ip}(k)$ at the lowpass filter TP11. Its output signal arrives as signal $x_{ipio}(k)$ via the predistortion unit DS11 as signal $\hat{y}_0(k)$ at a second branch ZWG2.

With $2 \leq j \leq m-1$, a jth branch ZWGj features in each case a delay unit DLjl, a first adder Aj1, a second adder Aj2, a digital lowpass filter Tpj1 and a distortion unit DSj1, which takes account of memory effects.

With j=m the mth branch ZWm merely contains a delay unit DLm1, a first and a second adder Am1 or Am2 and a digital lowpass filter TPm1.

With $2 \leq j \leq m$, the input signal $x_i(k)$ is connected on the input side to the delay unit DLj1 of the jth branch ZWGj. The delay unit DLj1 is connected on the output side to a first input of the first adder Aj1, which forms an error signal by addition. The first adder Aj1 is connected on the output side to an input of the lowpass filter TPj1, to which the error signal formed is fed. The lowpass filter TPj1 is connected on the output side to a first input of the second adder Aj2.

With $2 \leq j \leq m-1$ the second adder ADj2 of the jth branch ZWGj is connected on the output side on the one hand directly to a second input of the second adder A(+1)2 of a subsequent branch ZWGj+1. On the other hand it is connected via the predistortion unit DSj1 to the jth branch ZWGj to a second input of the first adder A(j+1)1 of the j+1th branch ZWGj+1.

With j=2, for the jth branch ZWGj the second input of the second adder Aj2 is connected to an output of the lowpass filter TP11 of the first branch ZWG1, while the second input of the first adder Aj1 is connected to an output of the distortion unit DS11 of the first branch ZWG.

With $1 \leq j \leq m-1$ a negated estimated signal of the transmit power amplifier is formed by the predistortion unit DSjl of a jth branch ZWj and transferred to the following j=ith branch ZWj+1 in each case.

A summation signal formed by the second adder ADm2 of the mth branch ZWm passes through a digital lowpass filter TPout to reach the subsequent transmit power amplifier as predistortion signal y(k). A decimation or reduction of the sampling rate can be executed here for the case in which the D/A converter is to have a low sampling rate.

Viewed in conclusion, error signals are formed by the first adders A21 to Am1 in each case, which in the final analysis are fed to the second adders A22 to Am2 of the assigned branch. The distortion units DS11 to DS31 on the other hand form an estimated output signal of the transmit power amplifier, with the estimated output signal being formed to take into account memory effects of the transmit power amplifier. The second adders A22 to Am2 form on the output side a proportionate signal y(k), which is cascaded down to the last branch ZWGm through addition in each case, with the signal y(k) being formed after output-side filtering by means of lowpass filter TPFout. In this case the signal $x_{ipio}(k)$ of the first branch ZWG1 shown is also viewed as a proportionate signal y(k) which is transferred to the subsequent branch ZWG2.

Figure 9:
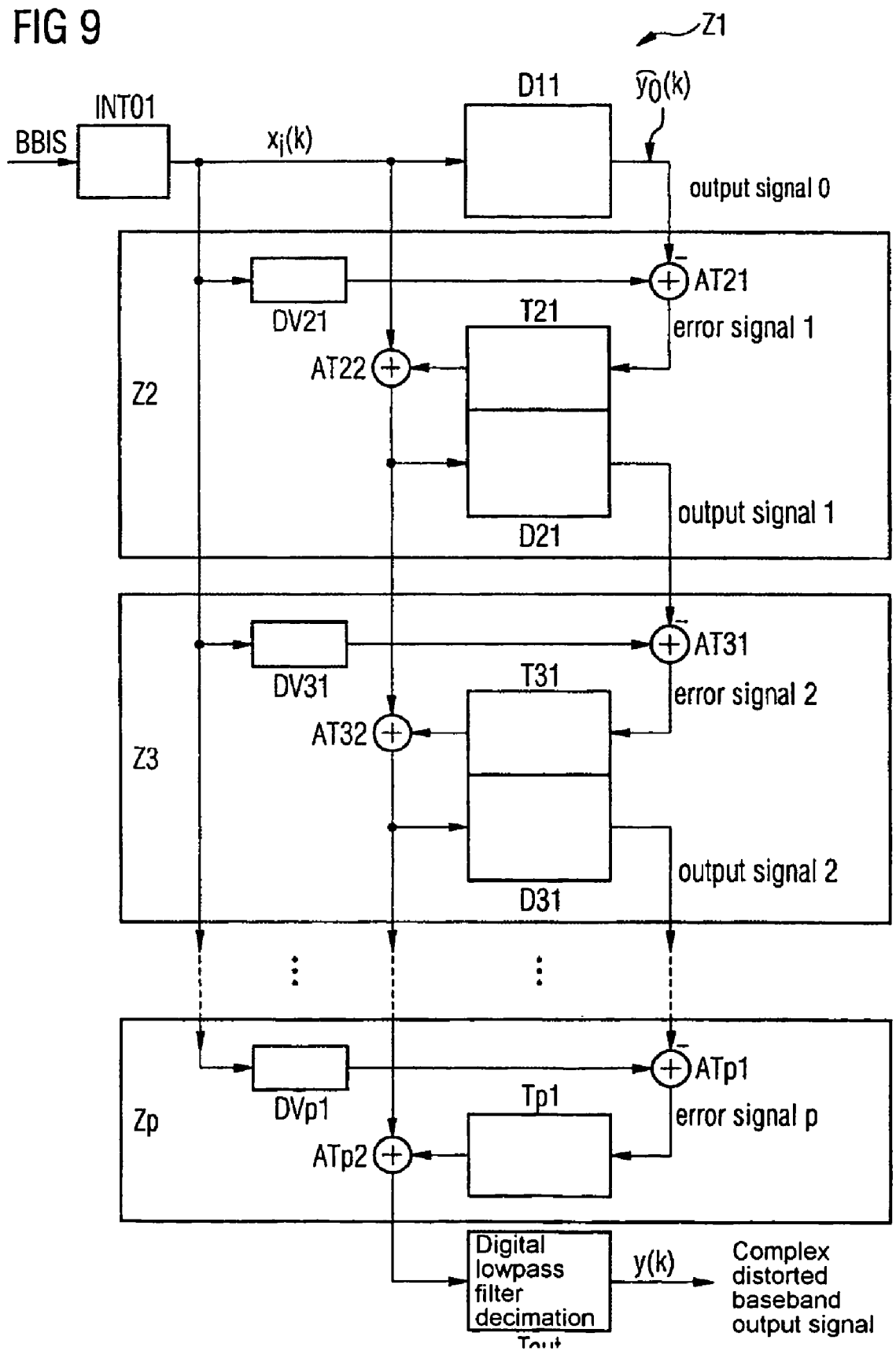

FIG. 9 shows a basic block diagram of the system which dispenses with the predistortion of the input signal undertaken in FIG. 7, assuming a number p of branches with $p \geqq m$.

Viewed in conclusion, error signals are formed by the first adders AT21 to ATp1 in each case, which in the final analysis are fed to the second adders AT22 to ATp2 of the assigned branch. The distortion units D1 to DS31 on the other hand form an estimated output signal of the transmit power amplifier, with the estimated output signal being formed to take into account memory effects of the transmit power amplifier. The second adders AT22 to ATp2 form on the output side a proportionate signal y(k), which is cascades down to the last branch Zp through addition in each case, with the signal y(k) being formed after output-side filtering by lowpass filter Tout. In this case the signal $x_i(k)$ of the first branch Z1 shown is also viewed as a proportionate signal y(k) which is transferred to the subsequent branch Z2.

Figure 10:
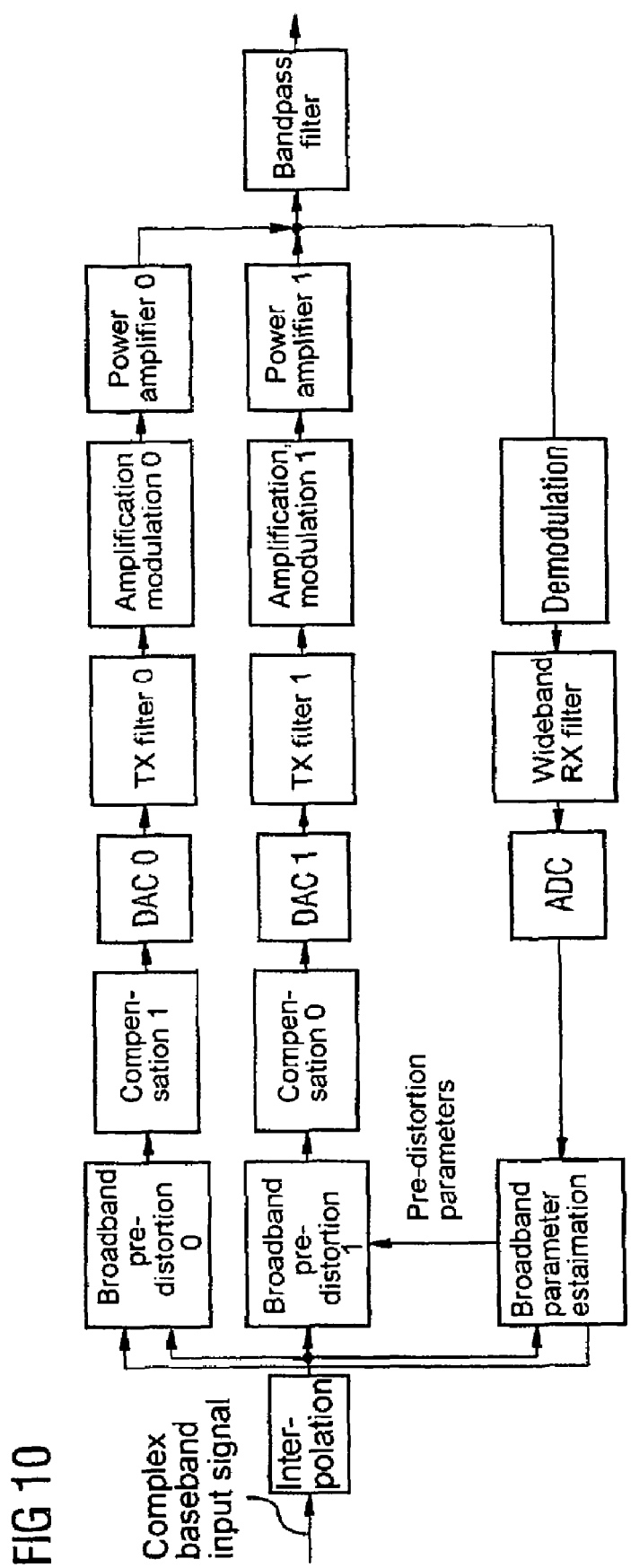

FIG. 10 shows a basic block diagram with two transmit power amplifiers for use of the system +, The procedures described above have been shown in this Figure with reference to a system with one output signal. They can be generally applied without restriction to a system with a plurality of power amplifiers.

Figure 11:
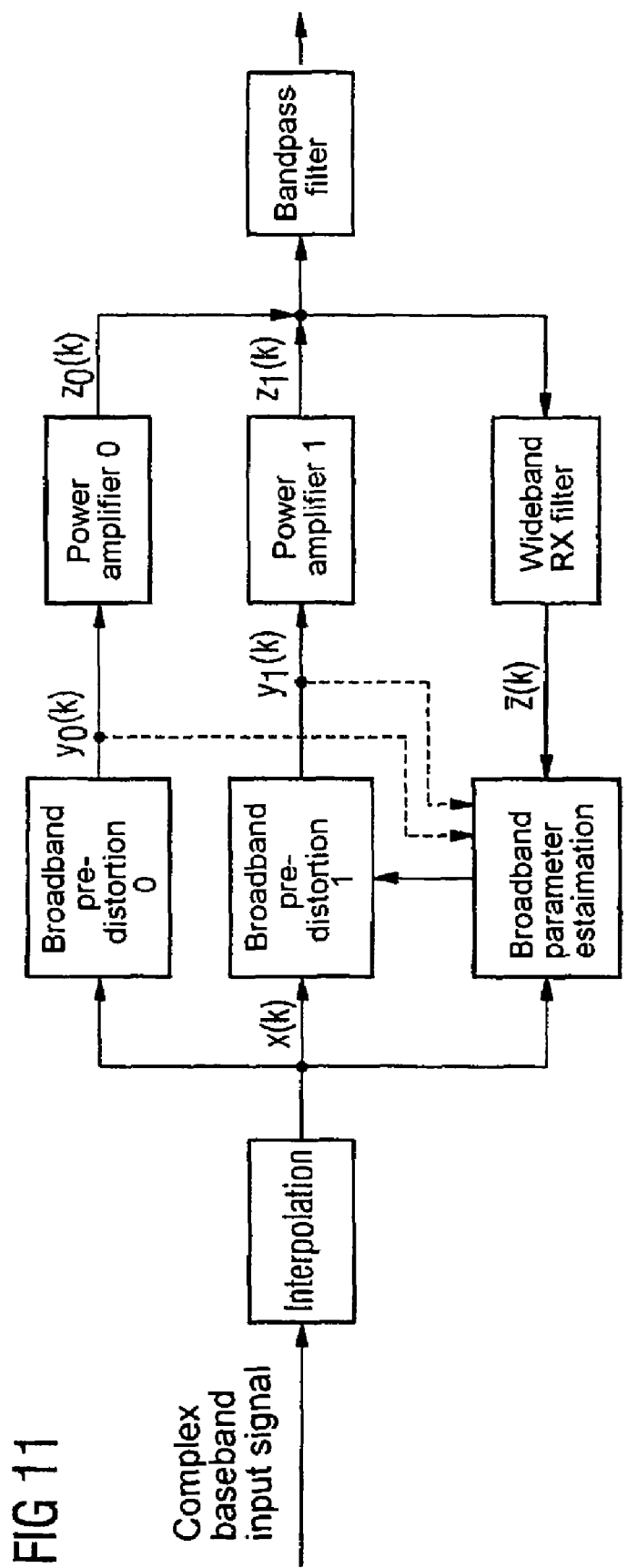

FIG. 11 shows, by comparison with FIG. 10, a simplified basic block diagram as a time-discrete equivalent system for using the system.

In a similar way the derived system shown in FIG. 10, an expanded equation system is determined which identifies parameters of the model for the two transmit power amplifiers shown in FIG. 10.

The following applies:

$$\begin{bmatrix} \alpha_{0,i} \\ \beta_{0,i} \\ \alpha_{1,i} \\ \beta_{1,i} \end{bmatrix} = \left( \vec{\check{Y}}_i^* \check{Y}_i \right)^{-1} \check{Y}_i^* z$$

The solution to this equation systems describes the optimum in the sense of a minimum error square. The iteration process described above for optimizing the parameters $\propto$ is executed accordingly.

Figure 12:
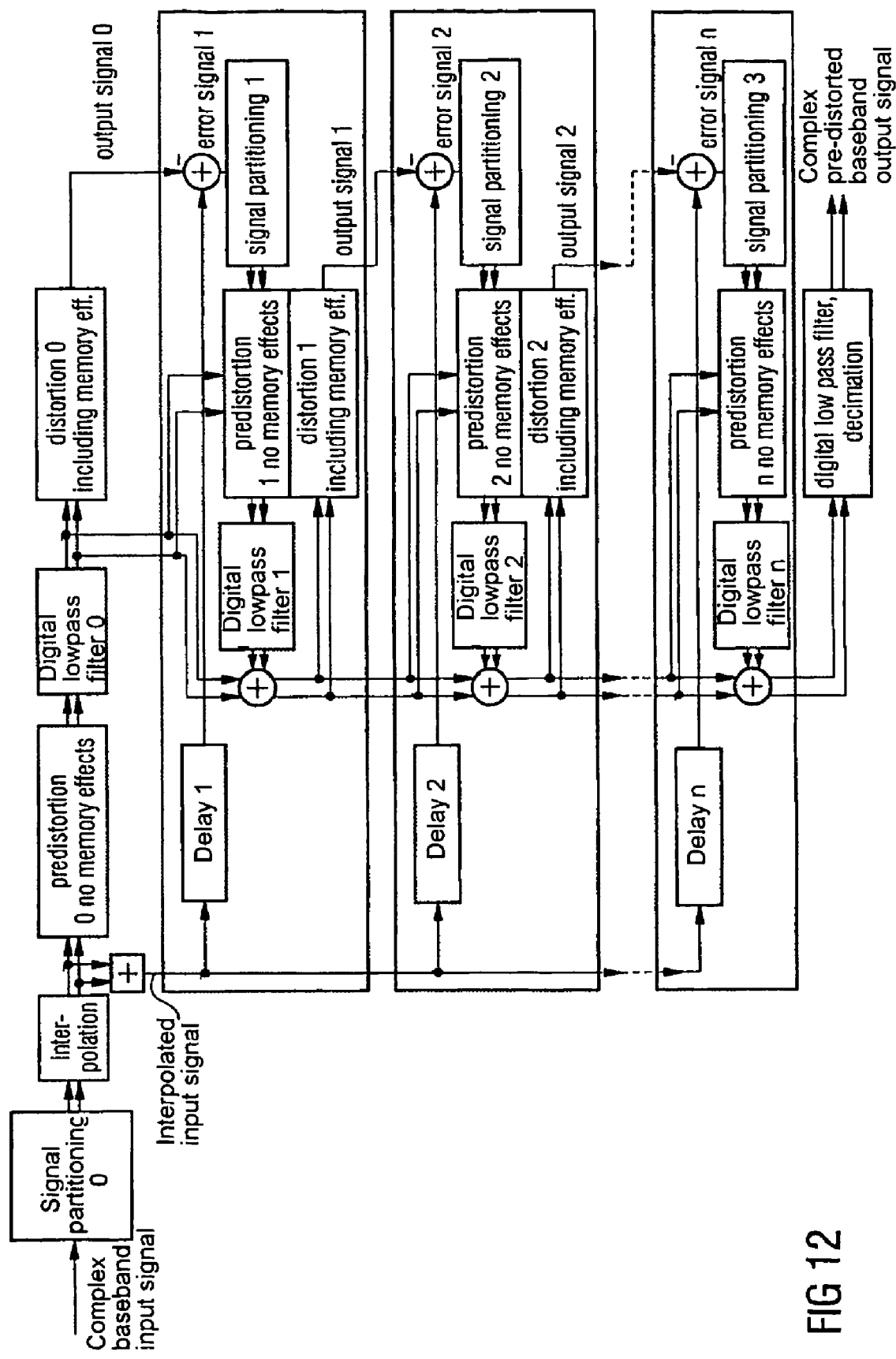
Figure 13:
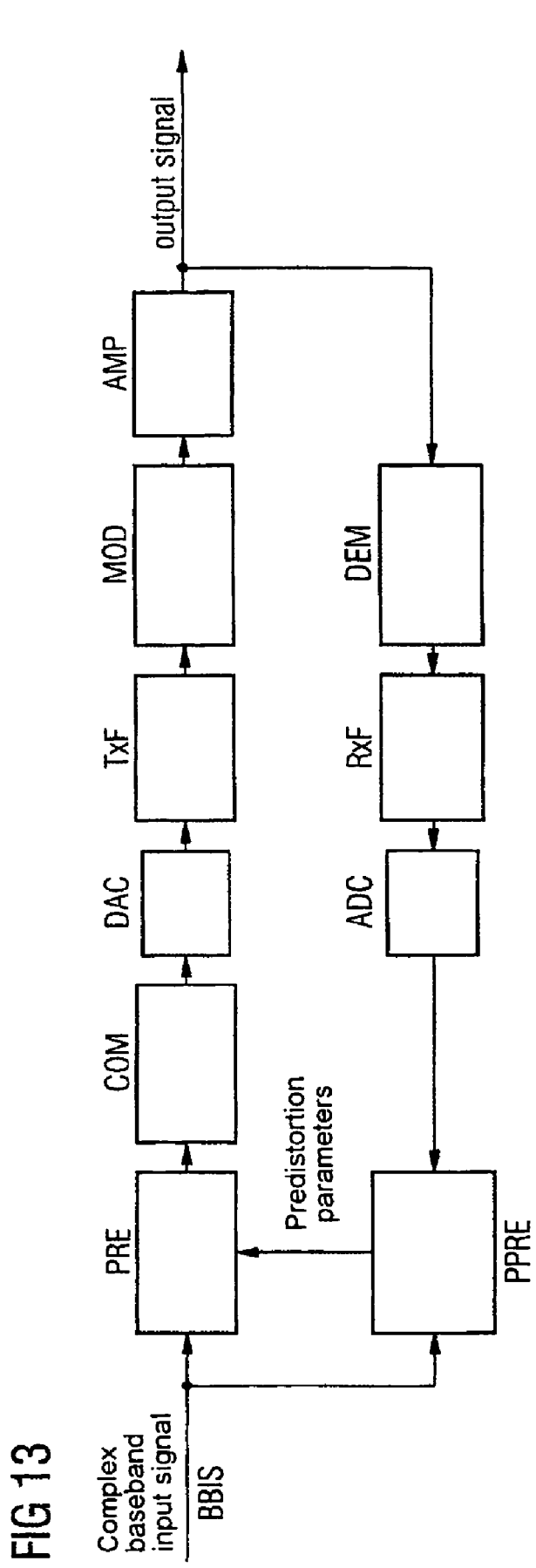

FIG. 12 shows a basic block diagram of the system when two transmit power amplifiers are used As shown in this Figure, the complex digital baseband input signal is divided up, two connection lines are subsequently specified in each case. Please note the following with regard to the function blocks shown here:

Function block "predistortion, no memory effects":

The behavior is entirely similar to the one-dimensional case shown in FIG. 6. The only difference is that two sets of parameters can be computed, with the aid of which two output signals can be computed from two input signals.

Function blocks "interpolation", "digital low pass filter" and "decimation":

The computation for the two input signals and for the two output signals is undertaken in two independent lowpass filters which each have the same frequency response.

Function block "distortion including memory effects":

An overall model combines the two input signals into a common output signal.

In addition a new function block "signal partitioning" is introduced, with the aid of which the error signal is divided between the two transmit power amplifiers.

It is especially advantageous in this case for a first transmit power amplifier to be implemented with high input power and with high efficiency, with strong distortions being created, whereas a second transmit power amplifier is operated with lower efficiency, only accepting peak values for correcting the error signal.

Simplifications such as those shown in FIG. 8 and FIG. 9 are to be performed in a similar way.

In addition it is especially advantageous to store estimated parameters for predistortion independently of specific characteristic values, such as for example the power of the input signal, the temperature of the power amplifier or the operating voltage, in a table. These parameters are thus rapidly available at any time through a load process, depending on the situation.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in Superguide v. DIRECTV, 69 USPQ2d 1865 (Fed. Cir. 2004).

The invention claimed is:

1. A system for forming a predistorted signal from a broadband interpolated baseband signal for a transmit power amplifier having n cascaded branches, comprising:
  a predistortion unit provided for the first branch of the amplifier, the predistortion unit producing an estimated output signal of the transmit power amplifier, the estimated output signal being formed based on memory effects of the amplifier, the predistortion unit having an input receiving the interpolated baseband signal as an interim predistorted signal;
  first and second adders, a distortion unit, a predistortion unit, and a digital filter provided for every jth branch of the amplifier where $2 \leqq j \leqq n$, wherein:
    the first adder has an input to receive the interpolated baseband signal via the distortion unit and an input to receive the output signal from the predistortion unit of the j−1th branch, the first adder having an output producing an error signal that is supplied to the digital filter,
    the second adder proportionately forms an interim predistorted signal, the second adder having an input to receive the error signal via the digital filter and an input to receive the interim predistorted signal from the j−1th branch, and
    the predistortion unit receives the interim predistorted signal from the second adder and produces an output signal; and
  a downstream filer connected to the output of the second adder of the nth branch, the downstream filter producing the predistorted signal.

2. The system in accordance with claim 1, wherein the downstream filter (TPout) is embodied for decimation of a sampling rate of the predistorted signal.

3. The system in accordance with claim 1, wherein a series circuit, comprising a pre-distortion unit and a digital filter is arranged in the first branch upstream to the predistortion unit, and
  the pre-predistortion unit exhibits a static characteristic curve which does not take any account of memory effects of the transmit power amplifier.

4. The system in accordance with claim 1, wherein
  a pre-predistortion unit is provided between the first adder and the digital filter, the pre-predistortion unit having a static characteristic curve, which does not take into account memory effects, and the pre-predistortion unit has a first input connected to the first adder and a second input connected to the input of the predistortion unit of the previous branch.

5. The system in accordance with claim 1, wherein each digital filter is embodied as a lowpass filter or bandpass filter.

6. The system in accordance with claim 1 wherein,
each distortion unit contains in a first branch a first delay unit for delay by L units of time,
each distortion unit contains in a further branch a series circuit with an absolute value generation and/or multiplication device and with an FIR,
the input signal of the distortion unit is fed to the branches on an input side, and
the branches are connected on an output side to an adder for forming the output signal of the distortion unit.

7. The system in accordance with claim 6, wherein the distortion unit is dimensioned with reference to the following reduced Laurent series development:

$$\check{z}(k-m_1) = y(k-l) + \sum_v \beta_{3,v}|y(k-v)|^2 y(k-v) +$$
$$\sum_v \beta_{5,v}|y(k-v)|^4 y(k-v) + \ldots +$$
$$\sum_v \beta_{\overline{3},v}|y(k-v)|^2 y(k-1-v) +$$
$$\sum_v \beta_{\underset{3,v}{\ldots}}|y(k-v)|^2 y(k+1-v) + \ldots$$

with y as the input signal of the distortion unit, k as the unit of time, β as parameters and with $\check{z}(k-m_1)$ as output signal of the distortion unit.

8. The system in accordance with claim 7, wherein an iteration process with multiple solutions in the sense of a minimum error square with parameters ∝ and β is determined by:

$$\left[\frac{\overline{\alpha}_i}{\overline{\beta}_i}\right] = (\underline{Y}_i^* \underline{Y}_i)^{-1} \underline{Y}_i^* \underline{z}$$

9. The system in accordance with claim 7, wherein an iteration process with multiple solutions in the sense of a minimum error square with parameters ∝ and β is determined by:

$$\left[\frac{\overline{\alpha}_i}{\overline{\beta}_i}\right] = (\underline{Y}_i^* \underline{Y}_i)^{-1} \underline{Y}_i^* \underline{z}$$

and by a convolution relationship $$\overline{\alpha}_{\mu,i} = \Theta_{\mu,i} * \overline{\alpha}_{\mu,i-1}$$

10. The system in accordance with claim 7, wherein the static characteristic curve of each predistortion unit is determined by the parameter β in such a way that a transmit power amplifier characteristic at a mid frequency is described inverted.

11. The system in accordance with claim 1, wherein output signals from a plurality of transmit power amplifiers are combined into an overall output signal which is used for band-restricted control signals.

12. A method for forming a predistorted signal from a broadband interpolated baseband signal for a transmit power amplifier that has a total of n cascaded branches, the method comprising:

for a first branch, feeding the interpolated baseband signal to a predistortion unit as an interim predistorted signal, the predistortion unit forming an estimated output signal of the first branch, taking into account memory effects of the transmit power amplifier;
for every jth branch where 2≦j≦n, adding the output signal from the previous branch to a time-delayed interpolated baseband signal to form an error signal;
for every jth branch where 2≦j≦n, filtering the error signal to produce a filtered error signal;
for every jth branch where 2≦j≦n, adding the filtered error signal to the interim predistorted signal from the previous branch to proportionately form an interim predistorted signal of the jth branch;
for every jth branch where 2≦j≦n, feeding the interim predistorted signal to a signal predistortion unit for forming the estimated output signal of the jth branch, taking into account memory effects of the transmit power amplifier;
forming the predistorted signal from the interim predistorted signal of the nth branch.

13. The method in accordance with claim 12, wherein in the first branch the interpolated baseband signal is pre-predistorted and filtered to form the interim predistorted signal, which is fed to the predistortion unit, the interpolated baseband signal being pre-predistorted without taking account of memory effects of the transmit power amplifier.

14. The method in accordance with claim 12, wherein each error signal is pre-predistorted before filtering, without taking account of memory effects of the transmit power amplifier.

15. The method in accordance with claim 12, wherein the time-delayed interpolated baseband signal is produced from the interpolated baseband signal on the basis of the following reduced Laurent series development:

$$\check{z}(k-m_1) = y(k-l) + \sum_v \beta_{3,v}|y(k-v)|^2 y(k-v) +$$
$$\sum_v \beta_{5,v}|y(k-v)|^4 y(k-v) + \ldots +$$
$$\sum_v \beta_{\overline{3},v}|y(k-v)|^2 y(k-1-v) +$$
$$\sum_v \beta_{\underset{3,v}{\ldots}}|y(k-v)|^2 y(k+1-v) + \ldots$$

with y as the interpolated baseband signal to be distorted, k as unit of time, with β as parameters and with $\check{z}(k-m_1)$ as the time-delayed interpolated baseband signal.

16. The method in accordance with claim 15, wherein an iteration process with multiple solution in the sense of a minimum error square with parameters ∝ and β is determined by:

$$\left[\frac{\overline{\alpha}_i}{\overline{\beta}_i}\right] = (\underline{Y}_i^* \underline{Y}_i)^{-1} \underline{Y}_i^* \underline{z}.$$

17. The method in accordance with claim 15, wherein an iteration process with multiple solutions in the sense of a minimum error square with parameters ∝ and β determined by:

$$\left[\frac{\overline{\alpha}_i}{\overline{\beta}_i}\right] = (\underline{\tilde{Y}}_i^* \underline{\tilde{Y}}_i)^{-1} \underline{\tilde{Y}}_i^* \underline{z}$$

and by a convolutional relationship $$\overline{\alpha}_{\mu,i} = \Theta_{\mu,i} * \overline{\alpha}_{\mu,i-1}$$

18. The method in accordance with claim 15, wherein the static characteristic curve of each predistortion unit is determined by the parameter $\beta$ in such a way that a transmit power amplifier characteristic at a mid frequency is described inverted.

* * * * *